United States Patent
Ushiki et al.

(10) Patent No.: US 6,619,530 B2
(45) Date of Patent: Sep. 16, 2003

(54) WIRE BONDING APPARATUS

(75) Inventors: Hiroshi Ushiki, Iruma (JP); Tooru Mochida, Higashiyamato (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/948,523

(22) Filed: Sep. 7, 2001

(65) Prior Publication Data

US 2002/0027152 A1 Mar. 7, 2002

(30) Foreign Application Priority Data

Sep. 7, 2000 (JP) .................................. 2000-272099

(51) Int. Cl.⁷ .................... B23K 37/00; B23K 31/00; B23K 31/02
(52) U.S. Cl. ........................... 228/4.5; 228/180.5
(58) Field of Search .............................. 228/4.5, 180.5

(56) References Cited

U.S. PATENT DOCUMENTS

| | | | |
|---|---|---|---|
| 4,172,544 A | * 10/1979 | Pennings et al. | 226/97.4 |
| 4,928,871 A | * 5/1990 | Farassat | 228/180.5 |
| 4,981,938 A | 1/1991 | Hanari et al. | 526/351 |
| 5,114,066 A | * 5/1992 | Amador et al. | 228/4.5 |
| 5,231,144 A | 7/1993 | Yamamoto et al. | 525/333.8 |
| 5,402,927 A | * 4/1995 | Frasch | 228/180.5 |
| 5,685,476 A | * 11/1997 | Miyoshi | 228/180.5 |
| 5,750,645 A | 5/1998 | Huang | 528/502 B |
| 6,258,893 B1 | 7/2001 | Okayama et al. | 525/191 |
| 6,376,058 B1 | 4/2002 | Schut et al. | 428/220 |

FOREIGN PATENT DOCUMENTS

| | | | |
|---|---|---|---|
| JP | 57-001238 A | * | 6/1982 |
| JP | S58-218131 | | 12/1983 |
| JP | 02-122639 A | * | 5/1990 |
| JP | H7-221133 | | 8/1995 |
| JP | 08-031857 A | * | 2/1996 |
| JP | 2617541 | | 3/1997 |

OTHER PUBLICATIONS

Beer et al., U.S. patent application Publication No. US 2002/0012781 A1, published Jan. 31, 2002.

* cited by examiner

Primary Examiner—Tom Dunn
Assistant Examiner—L. Edmondson
(74) Attorney, Agent, or Firm—Koda & Androlia

(57) ABSTRACT

A tension mechanism that applies a back tension to a wire in a bonding apparatus including: a first nozzle which has a through-hole through which the wire passes, second and third nozzles which have diameters that are larger than the diameter of the through-hole of the first nozzle and which are disposed above and below the first nozzle, a first air passage formed in the joining surfaces of the first nozzle and second nozzle, and a second air passage formed in the joining surfaces of the second nozzle and third nozzle. A compressed air supply device is connected to the tension mechanism and supplies compressed air to the first air passage from an air supply source, and a vacuum suction device is also connected to the tension mechanism and applies vacuum suction to the second air passage from a vacuum supply source.

4 Claims, 5 Drawing Sheets

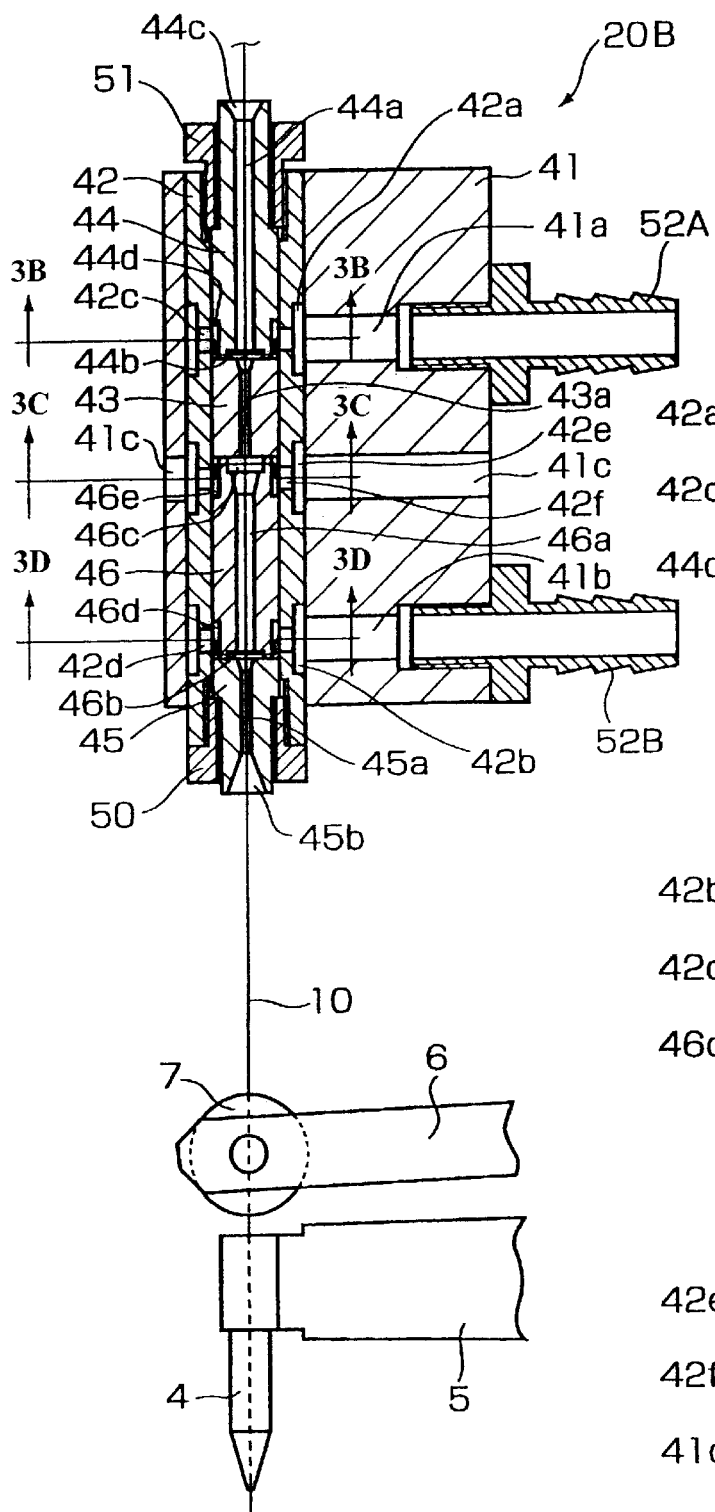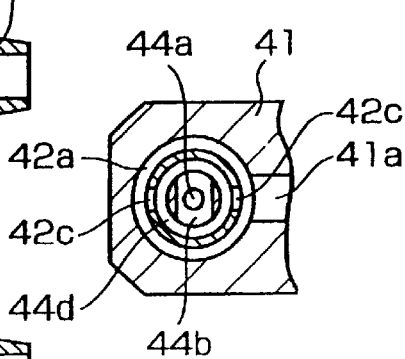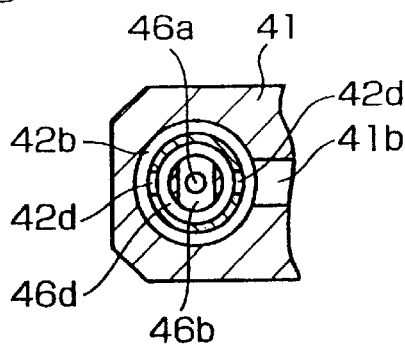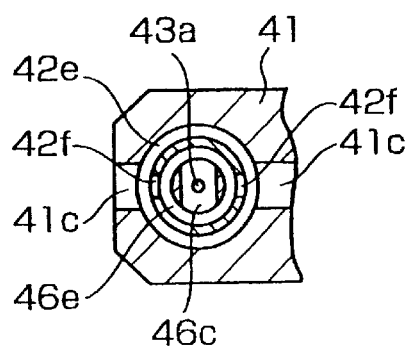

FIG. 4
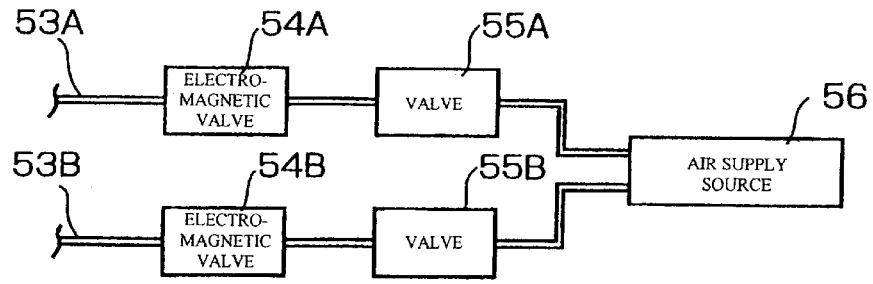
FIG. 5A
PRIOR ART
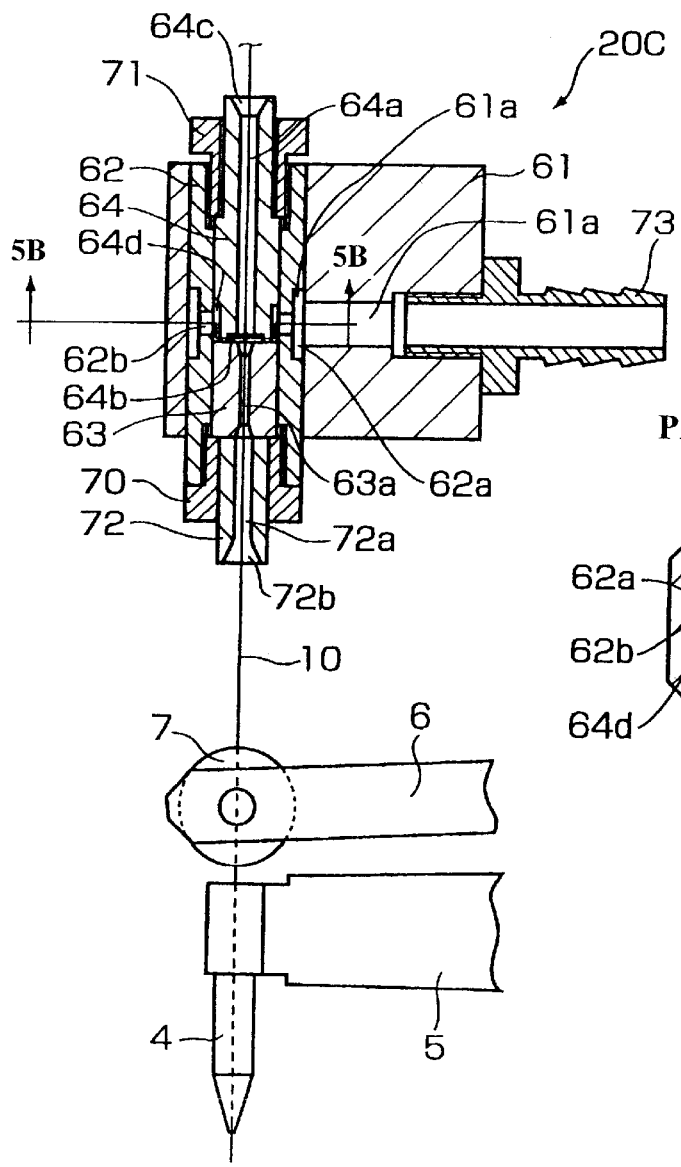
FIG. 5B
PRIOR ART

WIRE BONDING APPARATUS

BACKGROUND OF THE INVENTION

1. Field of the Invention

The present invention relates to a wire bonding apparatus and more particularly relates to a tension mechanism that applies tension to the wire.

2. Prior Art

A typical wire bonding apparatus is shown in FIG. 6.

A bonding head 2 is installed on an XY table 1 which is driven in X and Y directions on a horizontal plane. A raising-and-lowering mechanism 3 that is driven by a Z-axis motor (not shown) is installed on the bonding head 2 so that the raising-and-lowering mechanism 3 is moved up and down. A bonding arm 5, which holds a capillary 4 at its one end, and a damper supporting body 6 are fastened to the raising-and-lowering mechanism 3, and a damper 7 is disposed on the damper supporting body 6 so that the damper 7 is free to open and close.

Furthermore, a spool supporting body (not shown) that holds a wire spool 11 around which a wire 10 is wound, and a tension mechanism 20 which applies air tension to the wire 10, are provided on the bonding head 2. The wire 10 passes through the tension mechanism 20 and damper 7 from the wire spool 11 and further passes through the capillary 4. In FIG. 6, the reference numeral 15 refers to guide rails that guide lead frames 16.

The above type of bonding apparatus is disclosed in, for example, Japanese Patent No. 2617541 (Japanese Patent Application Laid-Open No. H2-122639).

The above-described bonding apparatus includes a tension mechanism that is shown in FIG. 5 with reference numeral 20C.

A tubular nozzle holder 62 is fastened by press-bonding to a main body 61. Inside the nozzle holder 62, a first nozzle 63 which has a through-hole 63a with a diameter that is slightly larger than the diameter of the wire 10 is disposed on the wire discharge side, i.e., on the capillary 4 side; and also a second nozzle 64 which has a through-hole 64a with a diameter that is larger than the diameter of the through-hole 63a is disposed on the wire supply side, i.e., on the wire spool 11 side. An air passage 64b is formed in the undersurface of the second nozzle 64, and a conical air exhaust passage 64c is formed in the upper surface of the through-hole 64a.

The first nozzle 63 is held by a first nut 70 that is screw-engaged with the nozzle holder 62. The second nozzle 64 is pressed downward by a second nut 71 which is screw-engaged with the nozzle holder 62, so that this second nozzle 64 is in pressing contact with the first nozzle 63. A wire guide 72 is fastened to the first nut 70 by press-bonding. A guide hole 72a is formed in the wire guide 72. The inner diameter of the guide hole 72a is larger than that of the through-hole 63a. Furthermore, a conical wire passage opening 72b is formed in the undersurface of the wire guide 72.

A recess-form air passage 64d is formed in the outer circumference of the lower part of the second nozzle 64. The air passage 64d communicates with the air passage 64b. A recess-form air passage 62a that corresponds to the air passage 64d is formed in the outer circumference of the nozzle holder 62. Furthermore, an air passage 62b is formed so as to communicate with the air passage 64d. An air supply passage 61a is formed in the main body 61 so as to communicate with the air passage 62a. A pipe coupling 73 is screwed into the air supply opening of the air supply passage 61a. A hose (not shown) is connected to the pipe coupling 73, and this hose is connected to an air supply source via an electromagnetic valve and a mechanical valve.

The action of the tension mechanism 20C will be described below.

When compressed air is supplied from the pipe coupling 73, the compressed air flows into the air passage 64b via the air supply passage 61a and air passages 62a, 62b and 64d. Since the diameter of the through-hole 64a of the second nozzle 64 is larger than the diameter of the through-hole 63a of the first nozzle 63, the compressed air that flows into the air passage 64b flows through the through-hole 64a and is discharged from the air exhaust opening 64c. As a result of the fluid resistance of the flow from the bottom to top through this through-hole 64a, a constant tension is applied to the wire 10 in the direction of the second nozzle 64 from the first nozzle 63.

The tension mechanism 20C is generally used in loop formation step during wire bonding. In other words, a loop is formed by first bonding a ball at the tip end of the wire 10 to a first bonding point and then by raising, moving and lowering the capillary 4 so that the capillary 4 is positioned at a second bonding point; and during these steps, tension is applied to the wire 10 by the tension mechanism 20 so that the wire 10 is not paid out from the lower end of the capillary 4 to an excessive extent.

Examples of wire bonding apparatuses equipped with a tension mechanism 20 as described above are disclosed in Japanese Patent No. 2617541 and Japanese Patent Application Laid-Open (Kokai) Nos. S58-218131 and H7-221133.

As disclosed in the above prior art, the tension adjustment is accomplished by valve adjustment in order to adjust the flow rate of the compressed air that is supplied to the pipe coupling 73. However, this adjustment is a fixed adjustment that is fixed beforehand for a particular work on which the bonding is performed, prior to the start-up of the wire bonding apparatus. Thus, it cannot meet the changes in the wire diameter, loop shape and wire length (i.e., the length of the wire corresponding to the distance between the first bonding point and second bonding point) that occur during wire bonding. As a result, the optimal loop shape for each wire that is connected is not obtained.

SUMMARY OF THE INVENTION

Accordingly, the object of the present invention is to provide a wire bonding apparatus that controls the tension applied to the wire in a plurality of different stages or strength during wire bonding, thus forming a better loop shape.

The above object is accomplished by a unique structure for a wire bonding apparatus that comprises a wire spool around which a wire is wound, a capillary through which the wire is passed, and a tension mechanism which is disposed between the wire spool and the capillary so as to apply a back tension to the wire; and the unique structure is that:

the tension mechanism is comprised of:
  a first nozzle which has a through-hole through which the wire passes and second and third nozzles which respectively are provided with through-holes that have a diameter greater than the diameter of the through-hole of the first nozzle, the second and third nozzles being disposed above and below the first nozzle,
  a first air passage formed in the joining surfaces of the first nozzle and the second nozzle, and a second air passage formed in the joining surfaces of the second nozzle and the third nozzle;

a compressed air supply means is provided so as to supply compressed air to the first air passage from an air supply source; and a vacuum suction means is provided so as to supply vacuum suction to the second air passage from a vacuum supply source.

The above object is further accomplished by another unique structure for a wire bonding apparatus which is equipped with a wire spool around which a wire is wound, a capillary through which the wire is passed, and a tension mechanism which is disposed between the wire spool and the capillary and which applies a back tension to the wire; and the unique structure is that the tension mechanism is comprised of first and third nozzles which have through-holes through which a wire passes and second and fourth nozzles which respectively have through-holes that have a diameter greater than the diameter of the through-holes of the first and third nozzles and through which the wire passes, the third nozzle, fourth nozzle, first nozzle and second nozzle being disposed in this order from the bottom to the top, first and second air passages respectively formed in joining surfaces of the first nozzle and the second nozzle and in joining surfaces of the third nozzle and the fourth nozzle, and an air exhaust passage which communicates with an outside and is formed in joining surfaces of the fourth nozzle and the first nozzle; and a compressed air supply means is provided so as to supply compressed air to the first and second air passages from an air supply source.

BRIEF DESCRIPTION OF THE DRAWINGS

FIG. 3A is a sectional side view of the essential portion of the tension mechanism used in the wire bonding apparatus according to another embodiment of the present invention, FIG. 3B is a sectional view thereof taken along the line 3B—3B in FIG. 3A, FIG. 3C is a sectional view taken along the line 3C—3C in FIG. 3A, and FIG. 3D is a sectional view thereof taken along the line 3D—3D in FIG. 3 (a);

FIG. 4 is a block diagram of the fluid control section in FIG. 3;

FIG. 5A is a sectional side view of the conventional tension mechanism used in a wire bonding apparatus, and FIG. 5B is a sectional view thereof taken along the line 5B—5B in FIG. 5A.

DETAILED DESCRIPTION OF THE INVENTION

One embodiment of the present invention will be described with reference to FIGS. 1 and 2.

Figure 1A:
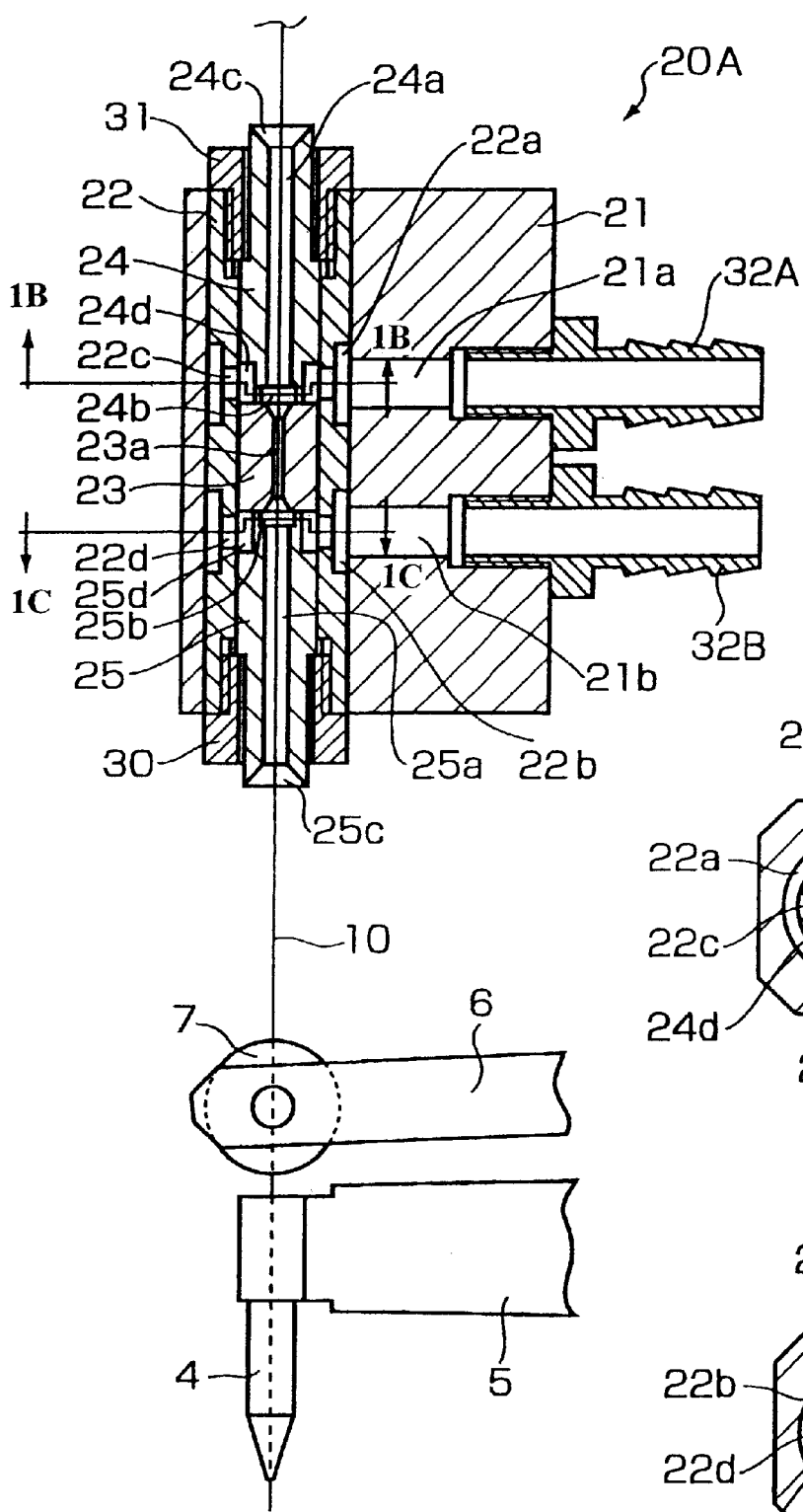
FIG. 1A is a sectional side view of the essential portion of the tension mechanism used in the wire bonding apparatus according to one embodiment of the present invention.
Figure 1B:
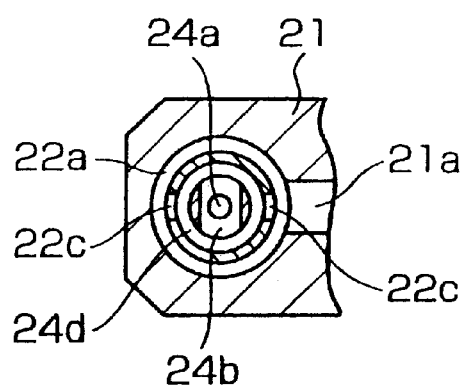
FIG. 1B is a sectional view thereof taken along the line 1B—1B in FIG. 1A.
Figure 1C:
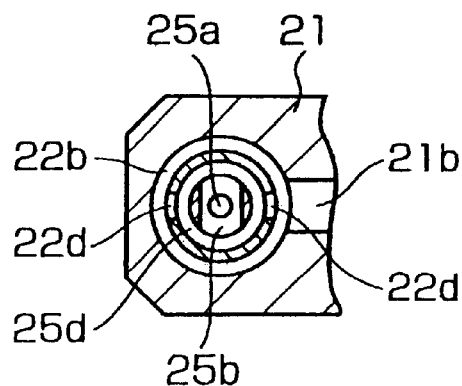
FIG. 1C is a sectional view thereof taken along the line 1C—1C in FIG. 1A.

In the tension mechanism 20A of this embodiment, as seen from FIGS. 1A through 1C, a tubular nozzle holder 22 is fastened by press-bonding to a main body 21. A second nozzle 24 and a third nozzle 25 are disposed above and below a first nozzle 23 inside the nozzle holder 22. The third nozzle 25 is held by a first nut 30 which is screw-engaged with the nozzle holder 22. The second nozzle 24 is pressed downward by a second nut 31 that is screw-engaged with the nozzle holder 22. Thus, the second nozzle 22 is in pressing contact with the first nozzle 23.

A through-hole 23a whose diameter is slightly larger than the diameter of the wire 10 is formed in the first nozzle 23. Also, through-holes 24a and 25a whose diameters are slightly larger than the diameter of the through-hole 23a are respectively formed in the second nozzle 24 and third nozzle 25. A first air passage 24b is formed in the undersurface of the second nozzle 24, and a conical air exhaust opening 24c is formed in the upper surface of the second nozzle 24. A second air passage 25b is formed in the upper surface of the third nozzle 25, and a conical air intake opening 25c is formed in the undersurface of the third nozzle 25.

Recess-form air passages 24d and 25d are respectively formed in the lower outer circumference of the second nozzle 24 and the upper outer circumference of the third nozzle 25. These air passages 24d and 25d respectively communicate with the first and second air passages 24b and 25b.

Recess-form air passages 22a and 22b are respectively formed in the outer circumference of the nozzle holder 22 so as to positionally correspond to the air passages 24d and 25d. Air passages 22c and 22d are respectively formed so that the air passages 22a and 22b communicate with the air passages 24d and 25d.

An air supply passage 21a and an air suction passage 21b are respectively formed in the main body 21 so that these passages communicate with the air passages 22a and 22b, and pipe couplings 32A and 32B are respectively screw-engaged with the air supply passage 21a and air suction passage 21b.

Figure 2:
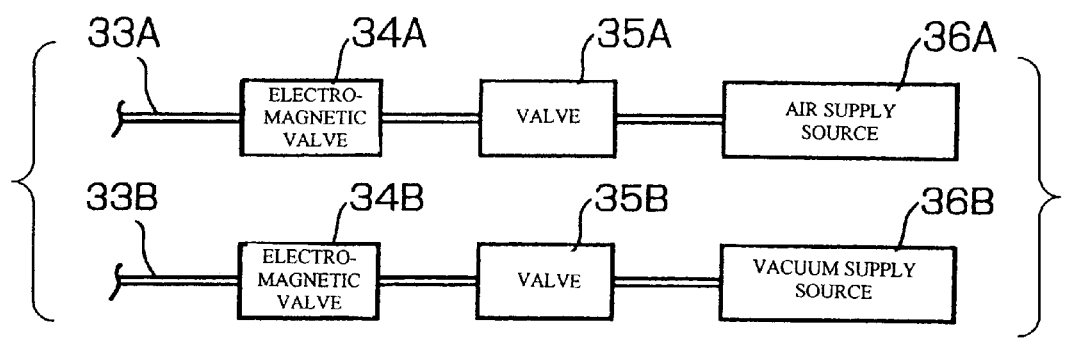
FIG. 2 is a block diagram of the fluid control section used in the bonding apparatus of FIG. 1.
Figure 6:
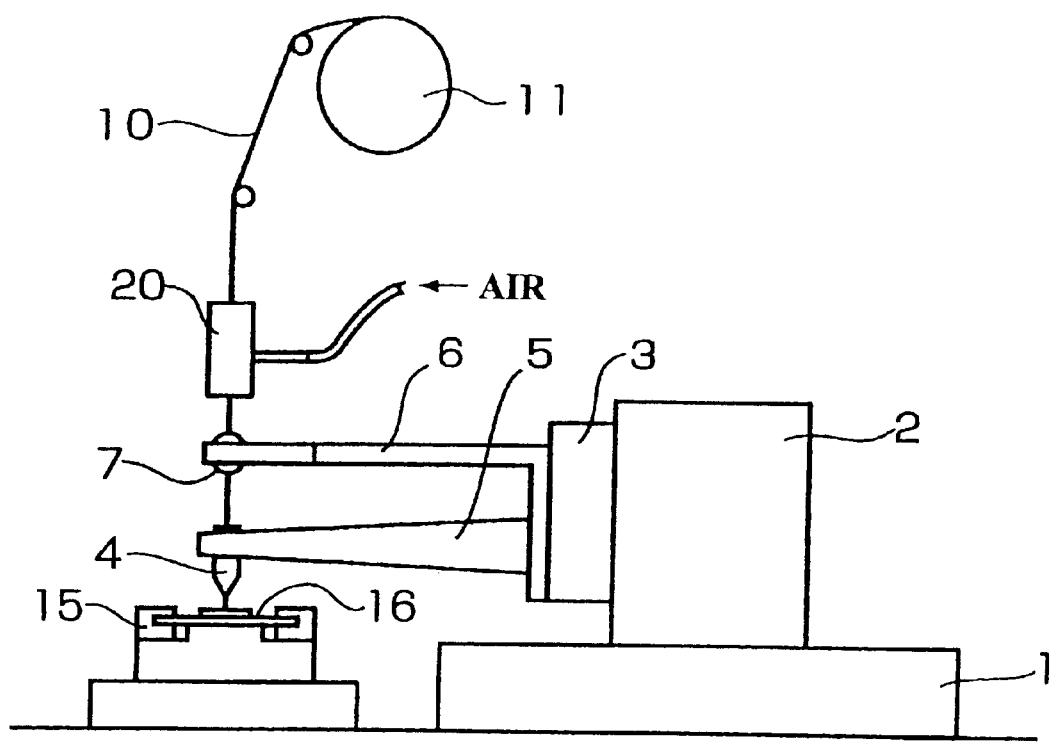
FIG. 6 is a side view of a prior art wire bonding apparatus.

One end of the pipe 33A shown in FIG. 2 is connected to the pipe coupling 32A, and the other end of the pipe 33A is connected to an air supply source 36A via an electromagnetic valve 34A and a mechanical valve 35A. One end of a pipe 33B is connected to the pipe coupling 32B, and the other end of this pipe 33B is connected to a vacuum supply source 36B via an electromagnetic valve 34B and a mechanical valve 35B.

The action of the tension mechanism 20A will be described.

When the electromagnetic valve 34A is switched on and the electromagnetic valve 34B is switched off, the compressed air supplied form the pipe coupling 32A flows into the first air passage 24b via the air supply passage 21a and the air passages 22a, 22c and 24d. Since the through-hole 24a of the first air passage 24b is larger than the diameter of the through-hole 23a of the first nozzle 23, the compressed air that has flowed into the first air passage 24b flows through the through-hole 24a and is discharged from the conical air exhaust opening 24c. As a result of the fluid resistance of the upward air flow in this through-hole 24a, a constant first tension is applied to the wire 10 in the direction from the first nozzle 23 toward the second nozzle 24.

When the electromagnetic valve 34A is switched off and the electromagnetic valve 34B is switched on, the vacuum suction force applied from the pipe coupling 32B acts on the second air passage 25b via the air suction passage 21b and air passages 22b, 22d and 25d. Since the diameter of the through-hole 25a of the third nozzle 25 is larger than the diameter of the through-hole 23a of the first nozzle 23, the vacuum suction force acting on the second air passage 25b acts on the through-hole 25a. As a result, outside air is sucked in from the conical air intake opening 25c. This outside air flows into the second air passage 25b via the through-hole 25a, and it further flows into the vacuum supply source via the air passages 25d, 22d and 22b, the air suction passage 21b and the pipe coupling 32B. As a result of the fluid resistance of the flow from below to above in the through-hole 25a, a constant second tension is applied to the wire 10 in the direction from the third nozzle 25 toward the first nozzle 23.

Accordingly, when the electromagnetic valves 34A and 34B are both switched on, a third tension, which is obtained by adding the first tension caused by the fluid resistance of the upward flow in the through-hole 24a and the second tension caused by the fluid resistance of the upward flow in the through-hole 25a, is applied to the wire 10.

Thus, three different tensions can be obtained by a combination of the on and off actions of the electromagnetic valves 34A and 34B. Let it be assumed that the first tension is adjusted to a value that is smaller than the second tension by the mechanical valves 35A and 35B. Accordingly, the electromagnetic valves 34A and 34B are switched in accordance with variations in the wire diameter, loop shape or wire length (wire length corresponding to the distance between the first bonding point and second bonding point) that occur during wire bonding. In cases where the wire length is short, e.g., 1 to 4 mm, the amount of slack in the wire 10 is small; accordingly, the first tension is applied. In cases where the wire length is somewhat long, e.g., 4 to 10 mm, the second tension is applied. In cases where the wire length is long, e.g., greater than 10 mm, then the third tension, which is produced by adding the first tension and the second tension, is applied. Thus, since the tension applied to the wire during wire bonding can be controlled in a plurality of different strength, a better loop shape can be formed.

In the above embodiment, the first air passage 24b is formed in the undersurface of the second nozzle 24. However, the first air passage 24b can be formed in the upper surface of the first nozzle 23. Likewise, though the second air passage 25b is formed in the upper surface of the third nozzle 25, the second air passage 25b can be formed in the undersurface of the first nozzle 23. In short, it is sufficient if the first air passage 24b is formed in the joining surfaces of the second nozzle 24 and first nozzle 23, and it is sufficient if the second air passage 25b is formed in the joining surfaces of the third nozzle 25 and first nozzle 23.

Another embodiment of the present invention will be described with reference to FIGS. 3 and 4.

In the tension mechanism 20B of this embodiment, as seen from FIGS. 3A through 3D, a tubular nozzle holder 42 is fastened to the main body 41 by press-bonding. Inside the nozzle holder 42, a first set consisting of a first nozzle 43 and a second nozzle 44 is installed so that it is above a second set that consists of a third nozzle 45 and a fourth nozzle 46. The third nozzle 45 is held by a first nut 50 that is screw-engaged with the nozzle holder 42. The second nozzle 44 is pressed downward by a second nut 51 that is screw-engaged with the nozzle holder 42, so that the second nozzle 42 is in pressing contact with the first nozzle 43.

Through-holes 43a and 45a which have diameters that are slightly larger than the diameter of the wire 10 are respectively formed in the first nozzle 43 and third nozzle 45. Also, through-holes 44a and 46a which have diameters that are larger than the diameters of the through-holes 43a and 45a are respectively formed in the second nozzle 44 and fourth nozzle 46. A first air passage 44b is formed in the undersurface of the second nozzle 44, and a conical air exhaust opening 44c is formed in the upper surface of the second nozzle 44. A second air passage 46b is formed in the undersurface of the fourth nozzle 46, and a conical air exhaust passage 46c is formed in the upper surface of the fourth nozzle 46. A conical wire passage opening 45b is formed in the undersurface of the third nozzle 45.

Recess-form air passages 44d and 46d are respectively formed in the lower outer circumferences of the second nozzle 44 and fourth nozzle 46, and these air passages 44d and 46d respectively communicate with the first and second air passages 44b and 46b.

Recess-form air passages 42a and 42b are respectively formed in the outer circumference of the nozzle holder 42 in positions corresponding to the air passages 44d and 46d, and air passages 42c and 42d are respectively formed so that the air passages 42a and 42b respectively communicate with the air passages 44d and 46d.

Air supply passages 41a and 41b are respectively formed in the main body 41 so that these passages communicate with the air passages 42a and 42b, and pipe couplings 52A and 52B are respectively screw-engaged with the air supply passages 41a and 41b. The pipes 53A and 53B shown in FIG. 4 are respectively connected at one end to the pipe couplings 52A and 52B, and the opposite ends of the pipes 53A and 53B are respectively connected to an air supply source 56 via electromagnetic valves 54A and 54B and mechanical valves 55A and 55B.

A recess-form air exhaust passage 46e is formed in the upper outer circumference of the fourth nozzle 46, and this air exhaust passage 46e communicates with the air exhaust passage 46c. An arc-shaped air exhaust passage 42e is formed in the outer circumference of the nozzle holder 42 so as to positionally correspond to the air exhaust passage 46e, and an air exhaust passage 42f is formed so that the air exhaust passage 42e communicates with the air exhaust passage 46e. An air exhaust passage 41c is formed in the main body 41 so that this passage communicates with the outside.

The action of the tension mechanism 20B shown in FIGS. 3A through 3D will be described.

When the electromagnetic valve 54A is switched on and the electromagnetic valve 54B is switched off, the compressed air supplied from the pipe coupling 52A flows into the first air passage 44b via the air supply passage 41a and air passages 42a, 42c and 44d. Since the diameter of the through-hole 44a of the second nozzle 44 is larger than the diameter of the through-hole 43a of the first nozzle 43, the compressed air that has flowed into the first air passage 44b flows through the through-hole 44a and is discharged from the conical air exhaust opening 44c. As a result of the fluid resistance of the upward flow through the through-hole 44a, a constant first tension is applied to the wire 10 in the direction from the first nozzle 43 toward the second nozzle 44.

When the electromagnetic valve 54A is switched off and the electromagnetic valve 54B is switched on, the compressed air supplied from the pipe coupling 52B flows into the second air passage 46b via the air supply passage 41b and the air passages 42b, 42d and 46d. Since the diameter of the through-hole 46a of the fourth nozzle 46 is larger than the diameter of the through-hole 45a of the third nozzle 45, the compressed air that has flowed into the second air passage 46b flows through the through-hole 46a and is discharged from the air exhaust passage 41c. As a result of the fluid resistance of the upward air flow inside this through-hole 46a, a constant second tension is applied to the wire 10 in the direction from the third nozzle 45 toward the fourth nozzle 46.

When the electromagnetic valves 54A and 54B are both switched on, a third tension produced by adding the first tension caused by the fluid resistance of the upward flow inside the through-hole 44a and the second tension caused by the fluid resistance of the upward flow inside the through-hole 46a is applied to the wire 10.

Thus, three different tensions can be obtained by a combination of the on and off actions of the electromagnetic valves 54A and 54B. Let it be assumed here that the first tension is adjusted to a value that is smaller than the second tension by means of the mechanical valves 55A and 55B. Accordingly, the electromagnetic valves 54A and 54B are switched in accordance with variations in the wire diameter, loop shape or wire length (wire length corresponding to the distance between the first bonding point and second bonding point) that occur during wire bonding. In cases where the wire length is short, the amount of slack in the wire is small; accordingly, the first tension is applied. In cases where the wire length is somewhat long, the second tension is applied. In cases where the wire length is long, the third tension, which is produced by adding the first tension and second tension, is applied. Thus, since the tension applied to the wire during wire bonding can be controlled in a plurality of different strength, a better loop shape can be formed.

In the above-described embodiment, the first air passage 44b is formed in the undersurface of the second nozzle 44. However, the first air passage 44b can be formed in the upper surface of the first nozzle 43. Likewise, though the second air passage 46b is formed in the undersurface of the fourth nozzle 46, the second air passage 46b can be formed in the upper surface of the third nozzle 45. In short, it is sufficient if the first air passage 44b is formed in the joining surfaces of the first nozzle 43 and second nozzle 44, and it is also sufficient if the second air passage 46b is formed in the joining surfaces of the third nozzle 45 and fourth nozzle 46.

As seen from the above, in the first embodiment of the present invention, a tension mechanism is comprised of:
a first nozzle which has a through-hole through which a wire passes and second and third nozzles which respectively have through-holes that have a diameter greater than the diameter of the through-hole of the first nozzle, the second and third nozzles being disposed above and below the first nozzle,
a first air passage formed in the joining surfaces of the first nozzle and the second nozzle, and
a second air passage formed in the joining surfaces of the second nozzle and the third nozzle;
a compressed air supply means is provided so as to supply compressed air to the first air passage from an air supply source; and
a vacuum suction means is provided so as to supply vacuum suction to the second air passage from a vacuum supply source.

Furthermore, in the second embodiment of the present invention, the tension mechanism is comprised of:
first and third nozzles which have through-holes through which a wire passes, and second and fourth nozzles which respectively have through-holes that have a diameter greater than the diameter of the through-holes of the first and third nozzles and through which the wire passes, so that the third nozzle, fourth nozzle, first nozzle and second nozzle are disposed in this order from the bottom to the top,
first and second air passages respectively formed in joining surfaces of the first nozzle and the second nozzle and in joining surfaces of the third nozzle and the fourth nozzle, and
an air exhaust passage which communicates with an outside and is formed in joining surfaces of the fourth nozzle and the first nozzle; and
a compressed air supply means is provided so as to supply compressed air to the first and second air passages from an air supply source.

Accordingly, it is possible to control the tension applied to the wire in a plurality of stages or strength during wire bonding, so that a good loop shape is obtained.

What is claimed is:

1. A wire bonding apparatus that comprises a wire spool around which a wire is wound, a capillary through which said wire is passed, and a back tension mechanism which is disposed between said wire spool and said capillary and applies a back tension to said wire, wherein:

said back tension mechanism is comprised of:
a first nozzle formed therein with a through-hole through which said wire passes,
second and third nozzles respectively formed therein with through-holes that have a diameter greater than a diameter of said through-hole of said first nozzle, said second and third nozzles being disposed above and below said first nozzle,
a first air passage provided in joining surfaces of said first nozzle and said second nozzle, and
a second air passage provided in joining surfaces of said first nozzle and said third nozzle; and wherein
said first air passage is connected to a compressed air supply means that supplies compressed air to said first air passage from an air supply source; and
said second air passage is connected to a vacuum suction means that supplies vacuum suction to said second air passage from a vacuum supply source.

2. A wire bonding apparatus that comprises a wire spool around which a wire is wound, a capillary through which said wire is passed, and a tension mechanism which is disposed between said wire spool and said capillary so as to apply a back tension to said wire, wherein said tension mechanism is comprised of:
first and third nozzles respectively formed therein with through-holes through which said wire passes, and second and fourth nozzles respectively formed therein with through holes that have a diameter greater than a diameter of said through-holes of said first and third nozzles and through which said wire passes, said third nozzle, fourth nozzle, first nozzle and second nozzle being disposed in said order from bottom to top of said tension mechanism,
first and second air passages respectively provided in joining surfaces of said first nozzle and said second nozzle and in joining surfaces of said third nozzle and said fourth nozzle, and
an air exhaust passage provided in joining surfaces of said fourth nozzle and said first nozzle and communicates with an outside; and wherein said first and second air passages are connected to a compressed air supply means that supplies compressed air to said first and second air passages from an air supply source.

3. The wire bonding apparatus according to claim 1, wherein said compressed air supply means and said vacuum suction means is respectively provided with electromagnetic valves, and wherein a plurality of different back tensions are provided by a combination of on and off actions of said electromagnetic valves.

4. The wire bonding apparatus according to claim 2, wherein said compressed air supply means is provided with an electromagnetic valve, which is connected to said first air passage and to said air supply source, and an electromagnetic valve, which is connected to said second air passage and to said air supply source, and wherein a plurality of different back tensions are provide by a combination of on and off actions of said electromagnetic valves.

* * * * *